(12) United States Patent
Gruber et al.

(10) Patent No.: US 7,713,575 B2
(45) Date of Patent: May 11, 2010

(54) METHOD AND APPARATUS FOR DEPOSITING COPLANAR MICROELECTRONIC INTERCONNECTORS USING A COMPLIANT MOLD

(75) Inventors: Peter A. Gruber, Mohegan Lake, NY (US); John Ulrich Knickerbocker, Monroe, NY (US)

(73) Assignee: International Business Machines Corporation, Armonk, NY (US)

( * ) Notice: Subject to any disclaimer, the term of this patent is extended or adjusted under 35 U.S.C. 154(b) by 1076 days.

(21) Appl. No.: 11/396,107

(22) Filed: Mar. 31, 2006

(65) Prior Publication Data

US 2007/0272389 A1    Nov. 29, 2007

(51) Int. Cl.
  *B05D 5/12* (2006.01)
(52) U.S. Cl. .................................. 427/58; 427/98.4
(58) Field of Classification Search .............. 427/58, 427/98.4
  See application file for complete search history.

(56) References Cited

U.S. PATENT DOCUMENTS

| | | | |
|---|---|---|---|
| 4,685,606 A | 8/1987 | Flint | |
| 5,244,143 A | 9/1993 | Ference | |
| 5,460,764 A | 10/1995 | Held | |
| 5,775,569 A | 7/1998 | Berger | |
| 5,866,952 A | 2/1999 | Wojnarowski | |
| 6,003,757 A | 12/1999 | Beaumont | |
| 6,056,191 A * | 5/2000 | Brouillette et al. | 228/254 |
| 6,105,852 A | 8/2000 | Cordes | |
| 6,127,735 A | 10/2000 | Berger | |
| 6,149,122 A | 11/2000 | Berger | |
| 6,231,333 B1 | 5/2001 | Gruber | |
| 6,332,569 B1 | 12/2001 | Cordes | |
| 6,340,630 B1 | 1/2002 | Berger | |
| 6,390,439 B1 | 5/2002 | Cordes | |
| 6,394,334 B1 | 5/2002 | Brouillette | |
| 6,527,158 B1 | 3/2003 | Brouillette | |
| 6,708,872 B2 * | 3/2004 | Gruber et al. | 228/248.1 |
| 6,832,747 B2 | 12/2004 | Cordes | |
| 6,893,799 B2 | 5/2005 | Danovitch | |

OTHER PUBLICATIONS

Gruber, et al., Low-cost wafer bumping, Paper, 1-23, IBM J. of Res. & Dev., vol. 49-4/5, Jul./Sep. 2005, USA.

(Continued)

*Primary Examiner*—Roberts Culbert
(74) *Attorney, Agent, or Firm*—Ference & Associates LLC

(57) ABSTRACT

A method and apparatus for the formation of coplanar electrical interconnectors. Solder material is deposited onto a wafer, substrate, or other component of an electrical package using a complaint mold such that the terminal ends of the solder material being deposited, i.e., the ends opposite to those forming an attachment to the wafer, substrate, or other component of an electrical package are coplanar with one another. A complaint mold is used having one or more conduits for receiving solder material and having a compliant side and a planar side. The compliant side of the mold is positioned adjacent to the wafer, substrate, or other component of an electrical package allowing solder material to be deposited onto the surface thereof such that the planar side of the compliant mold provides coplanar interconnectors. An Injection Molded Solder (IMS) head can be used as the means for filling the conduits of the compliant mold of the present invention.

14 Claims, 3 Drawing Sheets

OTHER PUBLICATIONS

Knickerbocker, J.U., et al., Dev. of next-gen. System-on-package (SOP) tech. based on silicon carriers with fine-pitch chip interconn., Jul. 2005, 725-52, IBM J. of Res. Dev. US.

Flip Chip Packaging, Technical Bulletin, Jul. 2005, 4 pages, Amkor Technology, USA.

Michaelsen, E., Controlled Collapse Chip Connection/New Process, Presentation, 26 pages, Sep. 2004, IBM, USA.

Injection Molded Soldering, IBM Online Publication, www.research.ibm.com/ims, 6 pages.

* cited by examiner

METHOD AND APPARATUS FOR DEPOSITING COPLANAR MICROELECTRONIC INTERCONNECTORS USING A COMPLIANT MOLD

FIELD OF THE INVENTION

The present invention relates generally to the formation of coplanar interconnectors, and more particularly relates to the field of depositing solder material interconnectors on wafers, substrates, and any other electronic packages requiring solder material microelectronic interconnections.

BACKGROUND OF THE INVENTION

As used herein the term "interconnector" means a solder-material-deposit attached to an electrical component capable of being electrically interconnected to another electrical component. In addition, the term "microelectronic interconnection" is meant to mean the connection established between two electrical components by one or more interconnectors in a microelectronic package. Finally, the term "solder material" should be understood to include traditional solders as known to those skilled in the art, as well as less traditional materials like lead free solders, polymer based materials, and various other combinations thereof.

Presently, there are a wide variety of microelectronic package interconnections used in modern semiconductor devices. Such microelectronic package interconnections include connections between: IC chips (chip-on-chip stacking), IC chips and carriers, carriers and substrates, and substrates and printed circuit cards. As the need for greater area array densities for microelectronic interconnections increases, improved techniques are developing that allow for solder material to be deposited onto receiving pads contained on wafers and substrates, e.g., bottom layer metallurgy (BLM) and bottom surface metallurgy (BSM).

Related to IC chip and chip carrier interconnections recent developments have been made in flip-chip solder bump technologies in response to increased demand for electrical performance, functionality, and reliability offered by wafer bumping as compared to other technological solutions like wire bonding for example. Using flip-chip technology, solder is deposited on the receiving pads of a wafer in the form of small bumps through the process known as wafer bumping. Unlike wire bonding, wafer bumping allows for area array interconnections across the entire surface of the chip to be deposited with solder bumps that are subsequently microelectronically interconnected to a substrate using a solder reflow process. At the substrate level, solder column connection (SCC) or ceramic column grid array (CCGA) or copper column grid array (CuCGA) technologies have developed providing a process for the attachment of solder columns to the metalicized pads of a substrate (e.g., BSM). Such techniques avoid the disadvantages associated with pin grid array (PGA) interconnections at this level such as higher cost and lower interconnection density.

For CCGA and CuCGA the PbSn (90%/10%), which has melting point greater than 260° C., or copper columns can be joined to a board using PbSn eutectic solder (37%/63%), which has a melting point of 183° C., or lead free solders, which have melting points between 217° C. and 231° C. These structures permit a solder column or copper column to be joined while maintaining a lower joining temperature, for connection to the board, with use of eutectic PbSn solder or lead free solders such as SnAgCu, SnAg, or SnCu. This type of structure also permits a larger height between package and board to be maintained for the solder column and joining solder metallurgy by creating a non-melting solder column and solder melting joining composition for surface attachment to the board. In this multi-solder structure, and for copper column plus solder attachment structures, the resulting product benefits from a longer life prior to fatigue failures of the mounting to a board in reliability testing and in product application for these surface mount attach structures as compared to lower height ball grid array mounting to a board, for similar package sizes.

As the types of interconnectors increases efficient ways for their formation and placement are also being developed. Injection-molded solder (hereinafter "IMS") technology has been steadily developing in the field of microelectronic interconnections. A discussion of wafer bumping using IMS head technologies is provided by P. A. Gruber, et al., *Low-Cost Wafer Bumping*, IBM J. Res. & Dev., Vol. 49 No. 4/5 (July/September 2005), hereby incorporated by reference. IMS has found applicability to flip-chip wafer bumping and CCGA substrate formation. Broadly, IMS wafer bumping is a two-step process in which solder is injected into a mold and subsequently transferred to the surface of a wafer or substrate using a reflow process. The IMS method allows for the controlled injection of molten solder using a variety of mold geometries. Thus the use of IMS has been extended beyond wafer bumping to other microelectronic interconnections, e.g., solder ball and solder column arrays as well as ceramic and organic chip carriers. IMS techniques are further adaptable to the use of a variety of Pb-free solders, including both ternary and quaternary alloys, thus, making the use of IMS more attractive as the microelectronics field moves from PbSn to Pb-free solder and other solder materials.

Even with the developments related to the microelectronic interconnections field, described above, however, significant challenges have yet to be effectively overcome. One of these problems is microelectronic interconnection non-coplanarity. While great pains are taken to create wafers and substrates with planer surfaces variations still remain. The result of depositing solder material interconnectors on non-planar wafers and substrates is non-coplanar interconnectors that negatively impact the resulting microelectronic interconnections. In addition, an efficient means for the creation of coplanar interconnectors that are comprised of more than a single solder material type and/or capable of having various shape geometries has yet to be developed in the field.

A need has therefore been recognized in connection with providing an effective means for achieving coplanar interconnectors and coplanar microelectronic interconnections.

SUMMARY OF THE INVENTION

There is broadly contemplated, in accordance with at least one presently preferred embodiment of the present invention, a method and apparatus for depositing solder material on a wafer, substrate, or other component of an electrical package in which a compliant mold having a rigid first side that is planar and a second side that is compliant, and having one or more conduits or cavities therein. In at least one embodiment of the method and apparatus of the present invention the use of an IMS head is used to flow the solder material into the conduits or cavities of the complaint mold. Broadly, the complaint mold is positioned between the IMS head and the receiving wafer, substrate, or other component of an electrical package with the complaint side adjacent to wafer, substrate, or other component of an electrical package and the planar side adjacent to the IMS head. Solder material is flowed from the IMS head into the compliant mold conduits or cavities and onto the wafer or substrate. In at least one embodiment of the present invention, the complaint mold further comprises two materials wherein the first material is rigid and forms the planar side of the complaint mold and the second material is less rigid and forms the complaint side of the complaint mold. Furthermore, a second complaint mold with conduits and/or cavities or reduced compression can be used in conjunction with the first mold after a first pass filling process has been performed. Thus creating additional cavities spaced directly adjacent to the first fill structure is also contemplated as a part of the method and apparatus of at least one embodiment of the present invention, whereby these cavities and/or conduits can be used to add additional solder material deposits to a wafer, substrate, or other component of an electrical package.

A first embodiment of the present invention is an apparatus for depositing coplanar solder material interconnectors on a wafer, said apparatus comprising: a first compliant mold having a plurality of conduits for receiving the solder material; and an injection mold soldering head for injecting the solder material, wherein said compliant mold is positioned between said injection mold soldering head and said wafer.

A second embodiment of the present invention is an apparatus for depositing coplanar solder material interconnectors on a wafer, said apparatus comprising: a first compliant mold having a plurality of conduits for receiving the solder material; an injection mold soldering head for injecting the solder material, wherein said compliant mold is positioned between said injection mold soldering head and said wafer; and a second compliant mold having a plurality of conduits for receiving solder material, wherein said second compliant mold is positioned between said injection mold soldering head and said wafer whereby additional solder material is deposited onto said wafer.

A third embodiment of the present invention is an apparatus for depositing coplanar solder material interconnectors on a wafer, said apparatus comprising: a compliant mold having a plurality of conduits for receiving the solder material; an injection mold soldering head for injecting the solder material, wherein said compliant mold is positioned between said injection mold soldering head and said wafer and a first pass solder is deposited while compressing the compliant mold; and a second or additional mold filling process is completed with an alternate solder composition while reduced force against the compliant mold is employed so as to leave additional solder adjacent to the first pass solder deposition and wherein said second pass of solder filling the compliant mold is positioned between said injection mold soldering head and said wafer whereby additional solder material is deposited onto said wafer.

In a another embodiment of the present invention a method for depositing coplanar solder material interconnectors on a wafer, comprising the steps of: placing a compliant mold having a plurality of conduits for containing said solder material between an injection mold soldering head and said wafer receiving said solder material; injecting said soldering material into said conduits; and after said injecting step removing said complaint mold.

In another embodiment of the present invention there is a method for depositing coplanar solder material interconnectors on a wafer with raised stud interconnections (Cu, metallic or polymer/metal composite studs, pillars, tubes, probes and/or seal band), comprising the steps of: placing a compliant mold having a plurality of conduits for containing said solder material between an injection mold soldering head and said wafer with raised interconnections receiving said solder material; injecting said soldering material into said conduits; and after said injecting step removing said complaint mold.

In another embodiment of the present invention there is a method for depositing coplanar solder material interconnectors on a substrate, comprising the steps of: placing a compliant mold having a plurality of conduits for containing said solder material between an injection mold soldering head and said substrate receiving said solder material; injecting said soldering material into said conduits; and after said injecting step removing said complaint mold.

For a better understanding of the present invention, together with other and further features and advantages thereof, reference is made to the following description, taken in conjunction with the accompanying drawings, and the scope of the invention will be pointed out in the appended claims.

DESCRIPTION OF THE PREFERRED EMBODIMENTS

Figure 1:
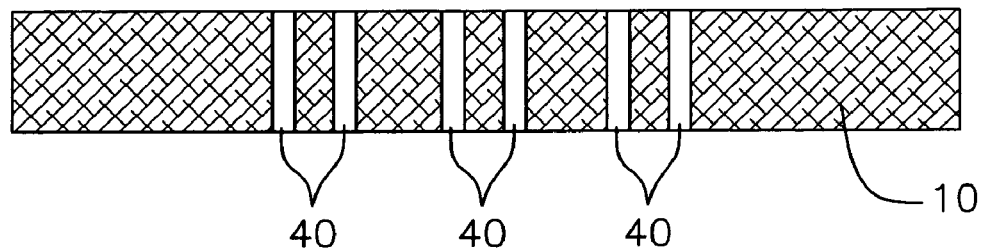
FIG. 1 schematically illustrates a compliant mold in accordance with at least one embodiment of the present invention, including holes or cavity formations.
Figure 2:
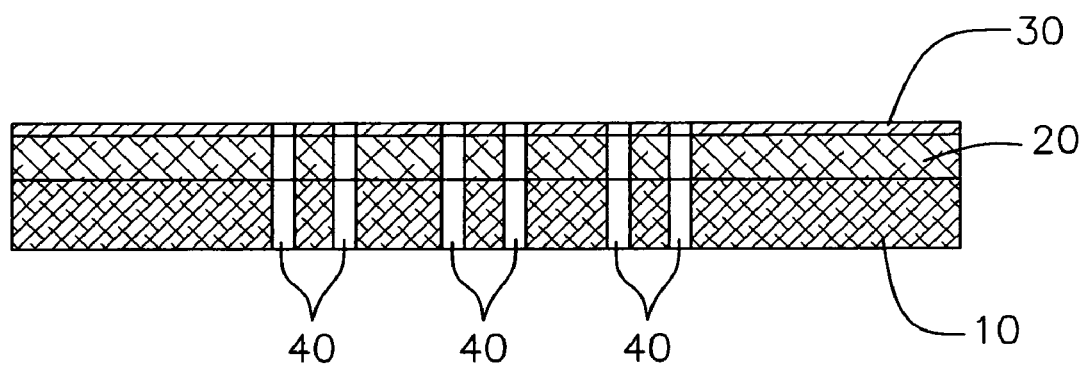
FIG. 2 schematically a compliant mold in accordance with at least one embodiment of the present invention, including one compliant side and one planer side.

Referring to the drawings, in FIG. 1 there is shown a compliant mold 10 in accordance with one preferred embodiment of the present invention. Complaint mold 10 may be formed from various materials based on the durometric properties associated with the particular material in light of the compliance requirements. Examples of the materials forming the compliant mold include polymer grid material, temperature resistant rubber, silicon based polymers, polyimide based polymers, as well as other alternative compliant materials. Furthermore, as illustrated in FIG. 2, the compliant mold 10 can be formed as a laminated structure having multiple layers. It is important that the material be formed such that it will have at least one compliant side 20 adaptable to compression and a more rigid side 30 to ensure proper planarity and cable of the mold-wafer/substrate alignment discussed below or alternatively the non-contact side (away from wafer or substrate) may provide a planar surface based on the injection mold head providing a planar surface while depositing solder into cavities and while compressing the compliant mold. In at least one preferred embodiment of the present invention the complaint mold is comprised of two layers, namely, a rigid top surface layer 30 with an underlying complaint layer 20. The planar rigid side 30 can be made of various materials known in the art including, inter alia, glass, borosilicate glass, silicon, silicon oxide, polymer based materials, polymer coated metal, metal, and plastic. Choice of material can be determined by many factors such as the coefficient of thermal expansion, cavity interconnection feature size and alignment accuracy to the wafer or substrate as well as the mechanical properties of the mold. For example, the use of borosilicate glass or silicon as the rigid planar side material of the compliant mold 10 can support not only co-planarity for solder deposition but also controlled alignment and CTE management of the compliant portion of the mold (i.e., high temperature rubber or silicone rubber) relative to the wafer or substrate receiving solder deposition through this IMS process. Compression of the composite/compliant mold against the wafer or substrate receiving solder and choice of IMS head gasket can prevent solder leakage during processing. Thus a mold could be a silicon wafer with adhered thin silicon rubber on one side with appropriately etched cavities in silicon and silicone rubber for use against a silicon wafer and could be a polymer coating on a thin copper plate with a high temperature silicone rubber layer on one side that could then contact an organic package or board with similar CTE. Furthermore, the compliant mold 10 as shown in accordance with a presently preferred embodiment of the invention includes formed conduits 40 allowing solder material to be formed in a desired shape, as well as allowing for the controlled depositing of the material onto the wafer, substrate, or board. It should be clearly appreciated that the conduits 40 can take on a variety of shapes and sizes depending upon the application. Such shapes might include holes, columns, cavity formations, and seal bands. Such conduits 40 in the compliant mold 10 can be made using a verity of techniques depending upon the type of material used for the formation of the mold.

For example, hole formation in silicon may be made by reactive ion etching and subsequent oxidation to provide a good cavity, good mechanical wear properties and desired surface properties resistant to reaction with solder. For borosilicate glass, cavities may be formed by chemical etching. For compliant rubber or silicone rubber materials, cavities can be formed by laser ablation or alternate means. Holes or cavities in polymer may be formed by photolithographic processes, laser ablation or rather than subtractive processes by additive build up or deposition processes.

Figure 3:
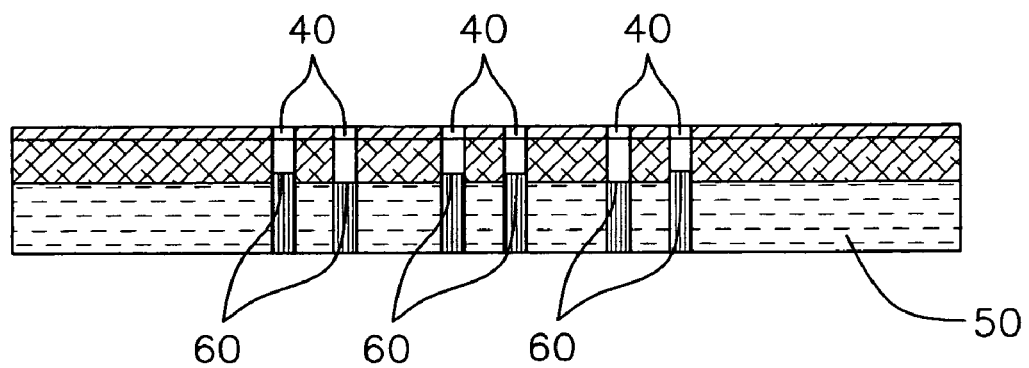
FIG. 3 schematically illustrates a compliant mold aligned over a wafer in accordance with at least one embodiment of the present invention.

As shown in FIG. 3, the complaint mold 10 is aligned with the wafer or substrate 50. The alignment methodology can utilize pins, optical alignment pads, edge references, prior attachment pins or balls, as well as other alternative methods known in the art. Conduits or cavities 40 in the compliant mold 10 are formed in a pattern mirroring the receiving pads 60 on the wafer or substrate 50. After the proper alignment is achieved, the complaint mold 10 and wafer or substrate 50 combination can be held together by clamping, applied pressure, or other methods known in the art.

Figure 4:
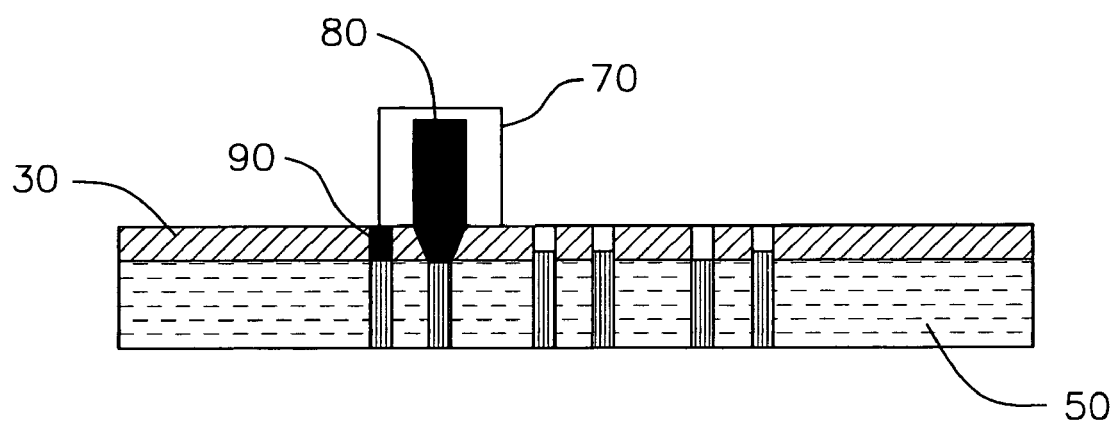
FIG. 4 schematically illustrates depositing of solder through complaint mold in accordance with at least one embodiment of the present invention.
Figure 5:
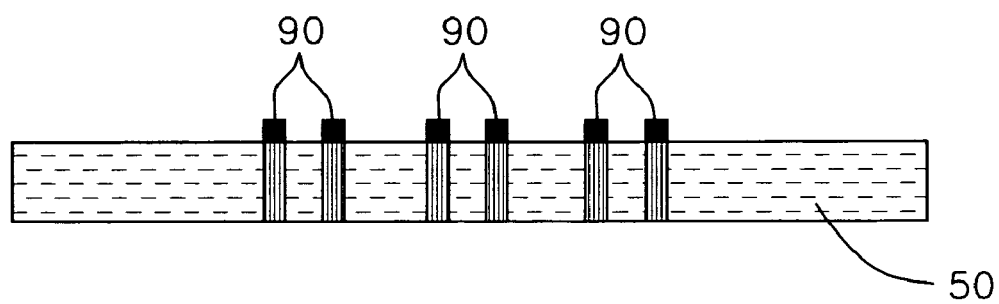
FIG. 5 schematically illustrates a wafer in accordance with at least one embodiment of the present invention having coplanar solder interconnectors.

As shown in FIG. 4, in a preferred embodiment of the invention an IMS head 70 scans the compliant mold 10 filling the compliant mold conduits (or cavities) 40 with injected solder material 80. It should be appreciated that a variety of solder materials could be injected into the mold holes or cavities. Such solder compositions are known in the art and include conductive polymers, high lead solder (e.g., 97Pb, 3Sn; 95Pb, 5Sn; 90Pb, 10Sn), eutectic solder (e.g., 37Pb, 63Sn), and lead free solder (e.g., 97.5Sn, 2.5Ag; SnAgCu (SAC eutectic alloy); SnCu (99.3Sn, 0.7Sn); AuSn (80Au, 20Sn); In; or Sn), as well as other alternative materials capable of providing electrical interconnections. Referring to FIG. 4, the conduits or cavities 40 are filled to approximately the level of the top rigid planar side 30 of the compliant mold 10. Where multiple conduits or cavities are filled by the IMS head 70 they are filled to the same level relative to the complaint mold's top rigid planar surface 30, thereby creating a coplanar surface of interconnectors 90, as shown in FIG. 5.

A metallurgical bond is established between the solder material 80 and the wafer or substrate 50 through known means, e.g., in wafer bonding solder can form attachments to BLM pads deposited on the wafer through solder "wetting" methods known to one skilled in the art. One may use flux processes and subsequent cleaning after solder joining to the BLM or copper studs; one may use no clean fluxes or formic acid enriched nitrogen atmosphere as examples of means to achieve good solder attachment to the contact pad on the wafer or substrate. Upon cooling, the solder material is more strongly bonded to the wafer or substrate pads 60 than to the compliant mold's conduits or cavities 40. Thus, upon the removal of the compliant mold 10, as shown in FIG. 5, a wafer or substrate 50 is formed having microelectronic interconnectors 90 with a coplanar surface, i.e., terminal end of each interconnector opposite to the interconnector-wafer or substrate attachment are coplanar with one another. The resulting wafer or substrate 50 can be used to form subsequent microelectronic interconnections. At this point the surface features can be coplanar based on solder injection molding by means of a coplanar process. Another means to achieve a coplanar surface is the use of a mechanical planar surface coining to flatten the top surface of the solder connections to create a coplanar surface subsequent to this IMS deposition process. Another method to achieve coplanarity of the interconnection surfaces is to use copper studs on the wafer which can be coined or which can receive solder depositions on their surfaces with either a one step coplanar deposition or subsequent coining of deposited solder to form a coplanar surface.

Figure 6:
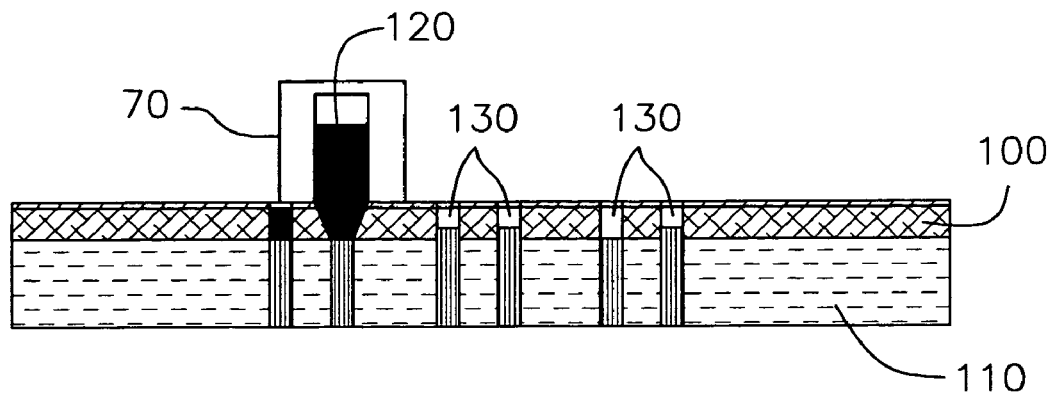
FIG. 6 schematically illustrates a wafer and aligned mold in accordance with at least one embodiment of the preset invention and the depositing of a first solder material through complaint mold in accordance with at least one embodiment of the present invention.
Figure 7:
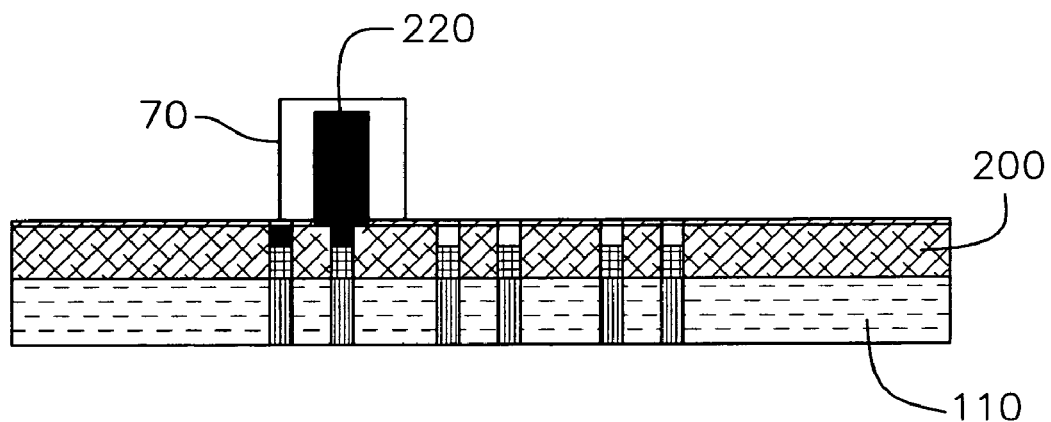
FIG. 7 schematically illustrates depositing of a second solder material through complaint mold in accordance with at least one embodiment of the present invention.
Figure 8:
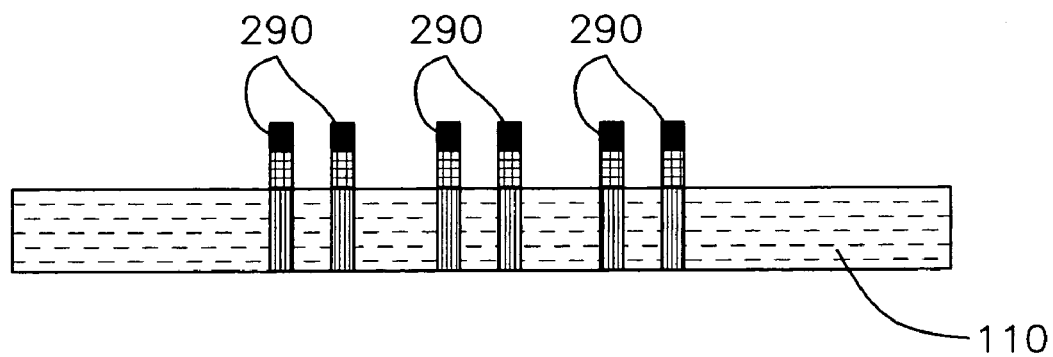
FIG. 8 schematically illustrates a wafer in accordance with at least one embodiment of the present invention having coplanar solder interconnectors consisting of two solder materials per interconnector.

A second preferred embodiment of the present invention is illustrated in FIGS. 6-8. IN a process similar to the method described above, multiple layers of varying solder material compositions can be deposited, i.e., stepped or built up, onto the surface of a wafer or substrate; therefore, it should be appreciated that the second embodiment enables the creation of microelectronic interconnectors wherein each interconnector is made of a plurality of soldering materials, which can take various forms, e.g., a stepped, side-by-side, encapsulation, et cetera.

As shown in FIG. 6, a first compliant mold 100 is aligned with a wafer or substrate 110 and a first high-melt solder material 120 is deposited onto the wafer or substrate 110 by the IMS head 70 at high compression via the compliant mold conduits or cavities 130. After the first solder material 120 is cooled and bonded to the wafer or substrate 110 and the first compliant mold 100 is removed a second compliant mold 200 having reduced compression durometric properties is aligned with the wafer or substrate 110 as illustrated in FIG. 7. A second IMS head scan is performed wherein a second solder material 220 having lower melting point characteristics is deposited in combination with the first solder material 120. The second complaint mold 200 is subsequently removed yielding a wafer or substrate 110 having coplanar interconnections 290 each of which is comprises two different solder materials as shown in FIG. 8. It should be appreciated that a number of different compliant molds could be used in a similar manner to create coplanar interconnectors made of a plurality of solder materials. Furthermore, it can also be appreciated by one skilled in the art that multiple compliant molds may be used to form layered or stepped multi-material solder interconnections as well as encapsulated compositions, i.e., a first deposited solder material could be enclosed by a second deposited material. Furthermore, it can be appreciated by one skilled in the art that a single compliant mold could be used to deposit a first pass solder deposition with higher compression of the mold followed by a second pass or passes at reduced pressure and reduced compression of the compliant mold, which can provide more than one solder deposition using the same mold and cavity per interconnection.

Likewise it should also be appreciated that multiple shapes of interconnectors could be formed using the method and apparatus of the present invention. For example, in another embodiment of the present invention a first complaint mold is used to deposit solder material having a first shape in the fashion described above onto a wafer or substrate. A second complaint mold is then used to deposit another solder material having a second shape. Thus geometries which might not otherwise be capable of formation in a single mold process can be formed in an efficient manner. For example, a first compliant mold could be used to deposit a particular interconnector shape, while a second compliant mold could be used to subsequently create seal bands. It should be appreciated the method of the present embodiment could be used to make solder deposit interconnectors with unique shapes having combinations of traditional metal based solder materials and polymer solder materials.

Although illustrative embodiments of the present invention have been described herein with reference to the accompanying drawings, it is to be understood that the invention is not limited to those precise embodiments, and that various other changes and modifications may be affected therein by one skilled in the art without departing from the scope or spirit of the invention.

What is claimed is:

1. A method for depositing coplanar solder material interconnectors on a wafer, comprising the steps of:
    placing a first compliant mold having a plurality of conduits for containing said solder material between an injection mold soldering head and the wafer receiving said solder material;
    injecting said soldering material into said conduits; and
    after said step of injecting the solder material, removing said first complaint mold;
    wherein said first complaint mold comprises:
        a first planar side; and
        a second compliant side; and
    wherein said first planar side and said second complaint side are separate layers of material.

2. The method according to claim 1, wherein:
    said compliant side is a material selected from the group consisting of rubber, silicon, and compliant polymer based material.

3. The method according to claim 1, wherein:
    said planar side is a material selected from the group consisting of silicon, silicon oxide, glass, and polymer coated metal.

4. The method according to claim 1, wherein:
    said first complaint mold is formed of a single material.

5. The method according to claim 1, further comprising the steps of:
    placing a second compliant mold having a plurality of conduits for receiving solder material between the injection mold soldering head and the wafer whereby additional solder material is deposited onto said wafer.

6. A method for depositing coplanar solder material interconnectors on a substrate, comprising the steps of:
    placing a first compliant mold having a plurality of conduits for containing said solder material between an injection mold soldering head and the substrate receiving said solder material;
    injecting said soldering material into said conduits; and
    after said step of injecting the solder material, removing said first complaint mold;
    wherein said first complaint mold comprises:
        a first planar side; and
        a second compliant side; and
    wherein said first planar side and said second complaint side are separate layers of material.

7. The method according to claim 6, wherein:
    said planar side is a material selected from the group consisting of silicon, silicon oxide, glass, and polymer coated metal.

8. The method according to claim 6, further comprising the steps of:
    placing a second compliant mold having a plurality of conduits for receiving solder material between the injection mold soldering head and the substrate whereby additional solder material is deposited onto said substrate.

9. The method according to claim 1, wherein said solder material comprises one or more of high lead solder, eutectic solder, and lead free solder.

10. The method according to claim 6, wherein said solder material comprises one or more of high lead solder, eutectic solder, and lead free solder.

11. A method comprising:
    placing a compliant mold having a plurality of conduits for containing solder material between an injection mold soldering head and a substrate receiving said solder material;
    injecting said soldering material into said conduits such that said solder material interconnectors are deposited on said substrate; and
    removing said complaint mold;
    wherein said complaint mold comprises:
        a first planar side; and
        a second compliant side, said second compliant side being a material selected from the group consisting of rubber, silicon, and compliant polymer based material; and
    wherein said first planar side and said second complaint side are separate layers of material.

12. The method according to claim 11, wherein:
    said first planar side is a material selected from the group consisting of silicon, silicon oxide, glass, and polymer coated metal.

13. The method according to claim 11, further comprising:
    positioning a second compliant mold having a plurality of conduits for receiving solder material between said injection mold soldering head and said substrate whereby additional solder material is deposited onto said substrate.

14. The method according to claim 11, wherein said solder material comprises one or more of high lead solder, eutectic solder, and lead free solder.

* * * * *